(12) United States Patent
Kizu et al.

(10) Patent No.: US 12,034,432 B2
(45) Date of Patent: Jul. 9, 2024

(54) VIBRATION ELEMENT, VIBRATOR, AND METHOD FOR PRODUCING VIBRATION ELEMENT WITH A VIBRATING PIECE HAVING A PROTRUDING PART FOR IMPROVED VIBRATION CHARACTERISTICS

(71) Applicant: Murata Manufacturing Co., Ltd., Nagaokakyo (JP)

(72) Inventors: Toru Kizu, Nagaokakyo (JP); Hiroshi Kumano, Nagaokakyo (JP); Koki Sai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 565 days.

(21) Appl. No.: 17/367,951

(22) Filed: Jul. 6, 2021

(65) Prior Publication Data

US 2021/0336602 A1  Oct. 28, 2021

Related U.S. Application Data

(63) Continuation of application No. PCT/JP2020/010482, filed on Mar. 11, 2020.

(30) Foreign Application Priority Data

Mar. 27, 2019 (JP) .................. 2019-061849

(51) Int. Cl.
*H03H 9/17* (2006.01)
*H03H 3/02* (2006.01)

(52) U.S. Cl.
CPC .............. *H03H 9/178* (2013.01); *H03H 3/02* (2013.01); *H03H 2003/022* (2013.01)

(58) Field of Classification Search
CPC .. H03H 9/178; H03H 9/02086; H03H 9/0519; H03H 9/1021; H03H 9/19; H03H 3/02; H03H 2003/022; H03H 2009/02464
See application file for complete search history.

(56) References Cited

U.S. PATENT DOCUMENTS

| 2011/0227457 A1* | 9/2011 | Ishikawa | H03H 9/177 310/365 |
| 2012/0235762 A1* | 9/2012 | Ii | H03H 9/0542 310/365 |
| 2014/0175944 A1 | 6/2014 | Koyama et al. | |

FOREIGN PATENT DOCUMENTS

| JP | 2004200777 A | 7/2004 |
| JP | 2012191300 A | 10/2012 |

(Continued)

OTHER PUBLICATIONS

International Search Report issued for PCT/JP2020/010482, date of mailing Jun. 2, 2020.

(Continued)

*Primary Examiner* — Emily P Pham
(74) *Attorney, Agent, or Firm* — ArentFox Schiff LLP

(57) ABSTRACT

A vibrator, a vibrating element and a method for producing the vibrating element may include vibrating piece having a central portion and a peripheral portion. The vibrator, the vibrating element and the method may further include a pair of excitation electrodes provided on a first side and a second side of a main surface of the central portion. The vibrator, the vibrating element and the method may further include a pair of connection electrodes provided on the peripheral portion and electrically connected to the pair of excitation electrodes. The vibrator, the vibrating element and the method may further include a substrate configured to be connected to the pair of connection electrodes via an electrically-conductive holding member interposed therebe- (Continued)

tween and configured to support the vibration element in an excitable manner.

17 Claims, 9 Drawing Sheets

(56)  References Cited

FOREIGN PATENT DOCUMENTS

| | | |
|---|---|---|
| JP | 2013141311 A | 7/2013 |
| JP | 2014127743 A | 7/2014 |
| JP | 2014180050 A | 9/2014 |
| JP | 2015080060 A | 4/2015 |
| JP | 2015186238 A | 10/2015 |

OTHER PUBLICATIONS

Written Opinion of the International Searching Authority issued for PCT/JP2020/010482, date of mailing Jun. 2, 2020.

* cited by examiner

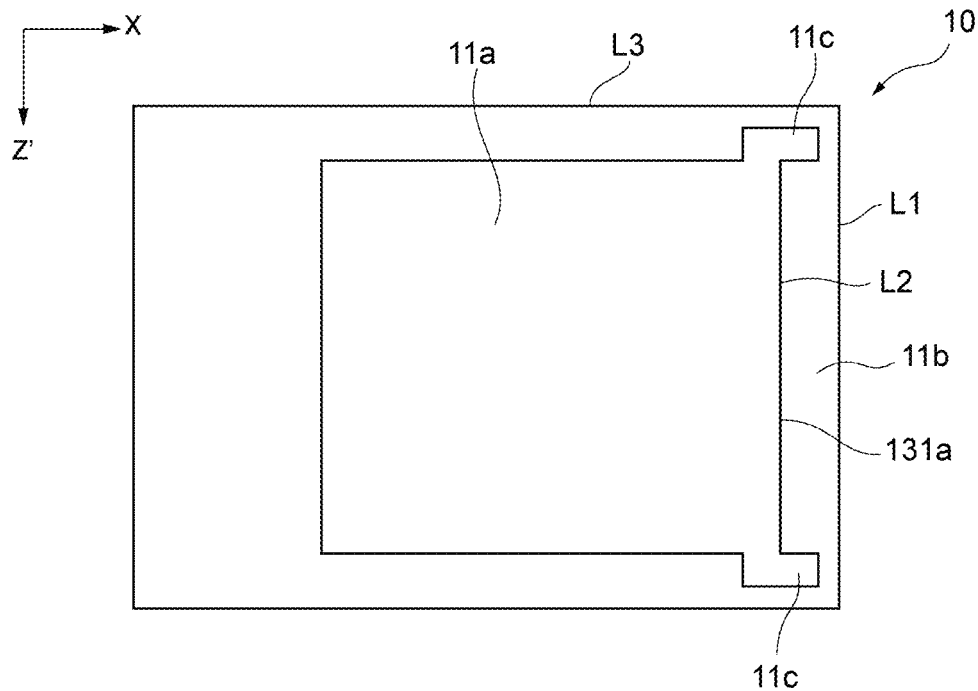
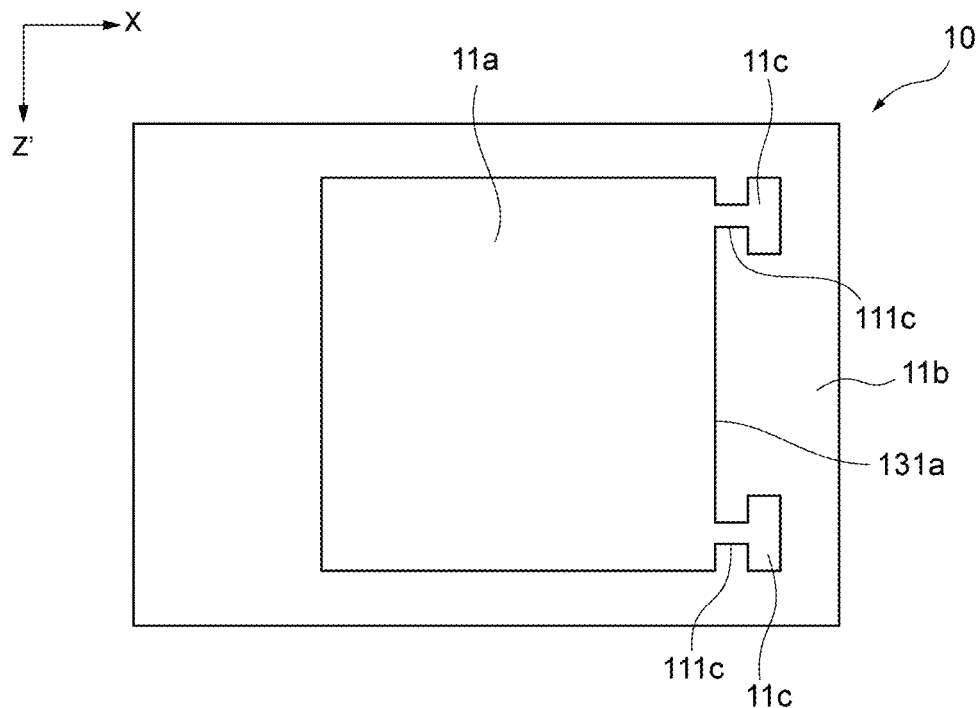

VIBRATION ELEMENT, VIBRATOR, AND METHOD FOR PRODUCING VIBRATION ELEMENT WITH A VIBRATING PIECE HAVING A PROTRUDING PART FOR IMPROVED VIBRATION CHARACTERISTICS

CROSS REFERENCE TO RELATED APPLICATIONS

This application is a continuation of International Application No. PCT/JP2020/010482, filed Mar. 11, 2020, which claims priority to Japanese Patent Application No. 2019-061849, filed Mar. 27, 2019, the entire contents of each of which are hereby incorporated in their entirety.

TECHNICAL FIELD

Aspects of the present disclosure are directed to a vibration element, a vibrator, and a method for producing the vibration element.

BACKGROUND OF THE INVENTION

A recent reduction in the size of a crystal vibrator narrows a gap between a crystal vibration element and an inner surface of a case in which the crystal vibration element is contained. Accordingly, in a case where the crystal vibration element is inclined with respect to the inner surface of the case, a mesa part (central part) that holds excitation electrodes of the crystal vibration element tends to make contact with the inner surface of the case. This inhibits free vibration of the crystal vibration element caused by the excitation elements, thereby affecting vibration characteristics of the crystal vibrator. It therefore may be necessary to make the mesa part (central part) of the small-sized crystal vibrator and the inner surface of the case less likely to make contact with each other.

For example, Japanese Unexamined Patent Application Publication No. 2014-180050 (hereinafter "JP '050") discloses a vibration element having a first region that vibrates mainly in a thickness-shear mode and has a constant thickness and a second region that is coupled to outer peripheral parts on both sides arranged along a vibration direction of the main vibration of the first region with a step interposed there between and has a thickness smaller than the first region, wherein in plan view, two first protruding parts are provided on a part of a main surface located on a second end portion side opposite to a first end portion side where a fixation part of the second region is disposed but excluding a central part of a width along a direction crossing the vibration direction so that the protruding parts are located apart from the first region and located inside an outer periphery of the vibration element, and a second protruding part is provided on a part of the main surface of the second region on the first end portion side. The vibration element disclosed JP '050 has protruding parts that are provided at a peripheral part of a crystal piece so as to be apart from a central part of the crystal vibrator so that the central part becomes less likely to make contact with an inner surface of a package.

However, according to the vibration element disclosed in JP '050, in a case where a crystal piece is provided with protruding parts, it may be necessary to reduce an area of a central part in order to secure an area for providing the protruding parts as compared with a case where a crystal piece is provided with no protruding part, even in a case where these crystal pieces have the same size. Since the area of the central part is reduced, an area of an excitation electrode that may be mounted on the central part is also reduced accordingly. This reduces an excitation region of the excitation electrode, thereby increasing an equivalent series resistance value of the vibration element. As a result, good vibration characteristics cannot be obtained in some cases.

SUMMARY OF THE INVENTION

According to an exemplary aspect of the disclosure, for addressing the problem described above, it may be to increase a size of a crystal piece so that even in a case where protruding parts are provided, a central part can keep an area obtained in a case where no protruding part is provided. However, a reduction in size of a vibration element cannot be realized due to the increase in size of a crystal piece.

The present disclosure has been accomplished in view of such circumstances, and an object of the present disclosure is to provide a vibration element, a vibrator, and a method for producing the vibration element that can achieve a reduction in size and obtain good vibration characteristics.

A vibrator according to an exemplary aspect of the present disclosure includes a vibration element including a vibrating piece having a central part and a peripheral part whose dimension in a thickness direction is smaller than the central part, a pair of excitation electrodes provided on central part main surfaces on both sides of the central part in the thickness direction, and a pair of connection electrodes electrically connected to the pair of excitation electrodes, respectively and provided on the peripheral part; a substrate connected to the connection electrodes of the vibration element with an electrically-conductive holding member interposed there between on one side in the thickness direction so as to support the vibration element in an excitable manner; and a lid part that covers the vibration element on the other side in the thickness direction, wherein the vibrating piece has at least one protruding part provided in contact with the central part when the central part main surfaces of the vibration element are viewed in plan view, and the at least one protruding part protrudes in the thickness direction in a position where the at least one protruding part makes contact with the substrate or the lid part in a case where the vibration element is inclined toward the substrate or the lid part while being supported on a side where the pair of connection electrodes are provided.

According to another aspect of the present disclosure, a vibration element, a vibrator, and a method for producing the vibration element make it possible to realize a reduction in size and obtain good vibration characteristics.

Additional advantages and novel features of the system of the present disclosure will be set forth in part in the description that follows, and in part will become more apparent to those skilled in the art upon examination of the following or upon learning by practice of the disclosure.

BRIEF DESCRIPTION OF THE DRAWINGS

In the descriptions that follow, like parts are marked throughout the specification and drawings with the same numerals, respectively. The drawings are not necessarily drawn to scale and certain drawings may be shown in exaggerated or generalized form in the interest of clarity and conciseness. The disclosure itself, however, as well as a mode of use, further features and advances thereof, will be understood by reference to the following detailed description of illustrative implementations of the disclosure when read in conjunction with reference to the accompanying drawings, wherein:

FIG. 5B is a plan view for explaining another example of protruding parts of a crystal vibration element in accordance with aspects of the present disclosure;

FIG. 5C is a plan view for explaining another example of protruding parts of a crystal vibration element in accordance with aspects of the present disclosure;

DETAILED DESCRIPTION

Figure 1:
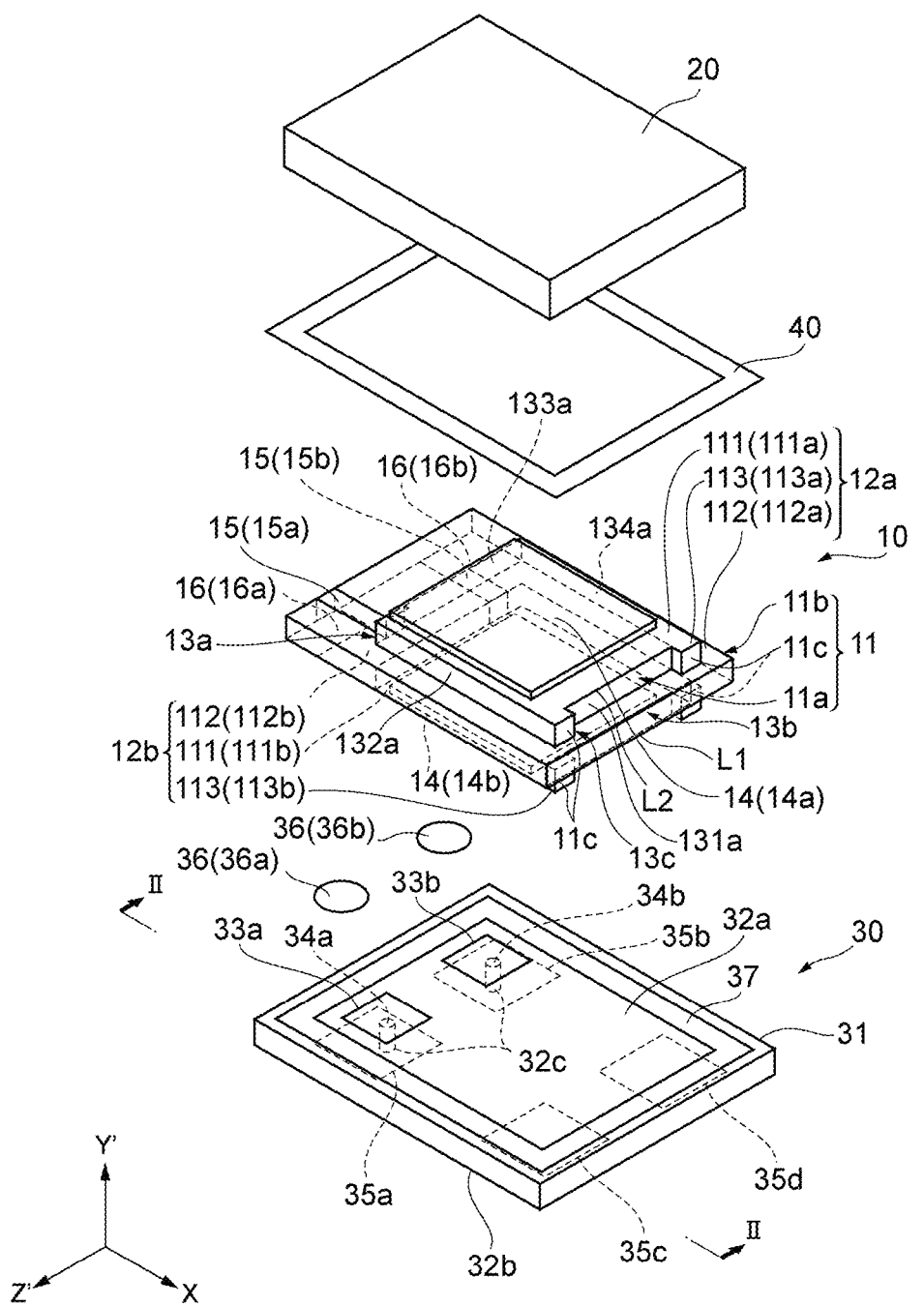
FIG. 1 is an exploded perspective view of a crystal vibrator in accordance with aspects of the present disclosure.

Aspects of the present disclosure is described below. In the drawings, identical or similar constituent elements are given identical or similar reference signs. The drawings are illustrative, and dimensions and shapes of parts are schematic illustration, and it should not be interpreted that the technical scope of the present disclosure is limited to specific aspects.

Figure 2:
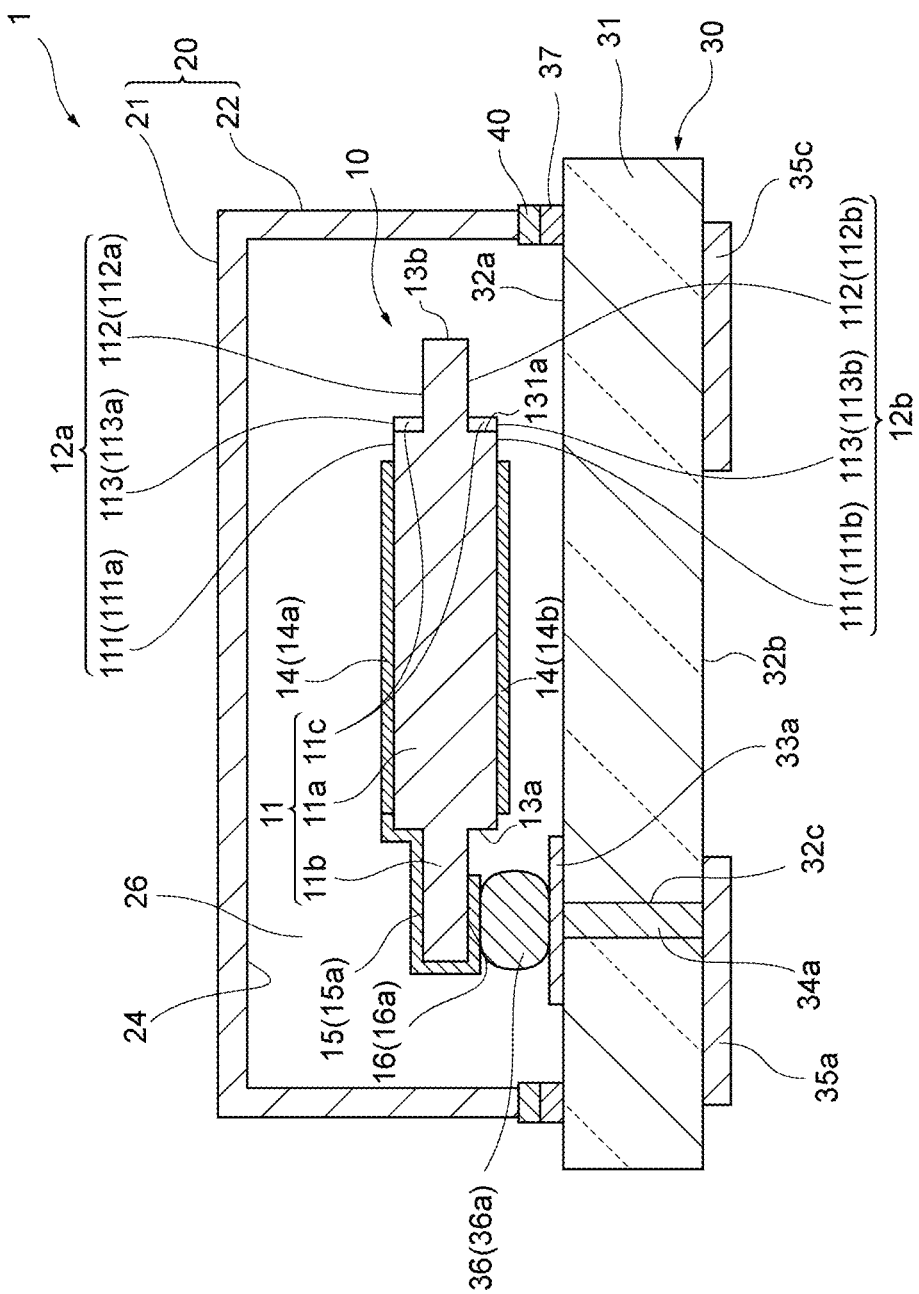
FIG. 2 is a cross-sectional view taken along line II-II of FIG. 1.

First, a crystal vibrator (Quartz Crystal Resonator Unit) 1 according to an exemplary aspect of the disclosure is described with reference to FIGS. 1 and 2. FIG. 1 is an exploded perspective view of the crystal vibrator 1, and FIG. 2 is a cross-sectional view taken along line II-II of FIG. 1. In FIG. 2, illustration of electrodes of a crystal vibration element 10 is omitted.

Furthermore, the crystal vibrator 1 includes electrically-conductive holding members 36a and 36b, and a sealing frame 37 and a joining member 40 that serve as joining members. The crystal vibrator 1 is an example of a vibrator, and the crystal vibration element 10 is an example of a vibration element.

In an exemplary aspect, the crystal vibration element 10 is mounted on the substrate 30 with the electrically-conductive holding members 36a and 36b interposed therebetween, and then the lid part 20 is joined to the substrate 30 with the sealing frame 37 and the joining member 40 interposed therebetween so as to cover the crystal vibration element 10. In this way, the crystal vibration element 10 is contained or sealed in an internal space 26 of a holder constituted by the lid part 20 and the substrate 30. In accordance with an aspect of the disclosure, the crystal vibration element 10, the lid part 20, and the substrate 30 may each have a rectangular shape, and directions of long sides and directions of short sides of these members match one another, when the crystal vibrator 1 is viewed in plan view along a thickness direction of the crystal vibrator 1.

The crystal vibration element 10 can include a plate shape. Furthermore, the crystal vibration element 10 can include a crystal piece 11 and a plurality of electrodes provided on the crystal piece 11. The plurality of electrodes include excitation electrodes 14a and 14b, extended electrodes 15a and 15b, and connection electrodes 16a and 16b.

In accordance with an aspect of the disclosure, the crystal piece 11 can be an AT cut crystal piece and is cut out from artificial crystal (Synthetic Quartz Crystal) so that a surface (hereinafter referred to as an "XZ' surface"; surfaces specified by other axes are also referred to in similar manners) parallel with a plane specified by an X axis and a Z' axis becomes a main surface assuming that crystal axes of the crystal are the X axis, a Y axis, and a Z axis and axes obtained by rotating the Y axis and the Z axis by 35 degrees 15 minutes±1 minute 30 seconds in a direction from the Y axis to the Z axis about the X axis are a Y' axis and the Z' axis, respectively. The crystal vibration element 10 that employs the AT cut crystal piece 11 mainly vibrates in a thickness-shear mode. In the crystal piece 11 according to as aspect of the disclosure, the thickness direction is parallel with a Y'-axis direction. When the crystal piece 11 is viewed in plan view along the Y'-axis direction, the XZ' surface of the crystal piece 11 has a rectangular shape having long sides parallel with an X-axis direction and short sides parallel with a Z'-axis direction. Details of constituent elements of the crystal vibration element 10 are described below.

The constituent elements of the crystal vibrator 1 are described below on the basis of the X-axis direction, the Y'-axis direction, and the Z'-axis direction of AT cut. The wording "plan view" means that these constituent elements are viewed in plan view along the thickness direction (the Y'-axis direction) of the crystal vibrator 1 (the constituent elements) unless otherwise specified. In a case where these constituent elements are viewed in plan view along two or more axis directions, expressions "on the XZ' plane," "on the XY' plane," and "on the Y'Z' plane" are used to distinguish the directions. The "XY' plane" means a cross section in the thickness direction. Shapes of the crystal vibration element 10, the lid part 20, and the substrate 30 seen when the crystal vibration element 10, the lid part 20, and the substrate 30 are viewed in plan view are referred to as "planar shapes" of these constituent elements.

The lid part 20 has a box shape opened on a side joined to the substrate 30, and a planar shape thereof is a rectangular shape larger than a planar shape of the crystal vibration element 10. The lid part 20 has a ceiling part 21 and a side wall part 22 that is formed so as to protrude from an outer edge of the ceiling part 21. Furthermore, the lid part 20 has an inner surface 24 having a concave shape constituted by a ceiling rear face 21a of the ceiling part 21 and an inner surface of the side wall part 22. Dimensions of the inner surface 24 in the X-axis direction, the Y'-axis direction, and the Z'-axis direction can be larger than those of the crystal vibration element 10.

A material for the lid part 20 is not limited in particular, and the lid part 20 is, for example, made of an electrically-conductive material such as a metal. This can add a shield function to the lid part 20 by electrically connecting the lid part 20 to a ground potential. Alternatively, the lid part 20 may be made of an insulating material or a complex structure of an electrically-conductive material and an insulating material.

The substrate 30 has a flat plate shape, and a planar shape thereof is a rectangular shape larger than the planar shape of the lid part 20. The substrate 30 supports the crystal vibration element 10 in an excitable manner and has a base 31 and a plurality of electrodes provided on the base 31. The plurality of electrodes include connection electrodes 33a and 33b, via electrodes 34a and 34b, and outer electrode 35a to 35d.

The base 31 is a sintered body obtained by laminating a plurality of sheets made of insulating ceramic, for example, alumina and sintering the laminated sheets. Alternatively, the base 31 may be made of a glass material, a crystal material, a glass epoxy resin, or the like. The glass material can be, for example, silicate glass or a material whose main component is a material other than silicate and is a material having a glass-transition phenomenon occurring due to a rise in temperature. The crystal material can be, for example, an AT cut crystal. The base 31 is preferably made of a heat resistant material. Furthermore, the base 31 may be a single layer or may be plural layers. In a case where the base 31 is plural layers, the base 31 includes an insulating layer as a topmost layer.

The base 31 has a first main surface 32a and a second main surface 32b, which are XZ' surfaces facing each other, and two via holes 32c that pass through the base 31 in the Y'-axis direction in the vicinity of a short side on a negative side in the X-axis direction. In an assembled state, the first main surface 32a faces the inner surface 24 (ceiling rear surface 21a) of the lid part 20 and constitutes the internal space 26 in which the crystal vibration element 10 is contained together with the inner surface 24. The second main surface 32b faces a mount substrate (not illustrated) on which the crystal vibrator 1 is mounted.

The connection electrodes 33a and 33b are provided on the first main surface 32a in the vicinity of the short side on the negative side in the X-axis direction. The outer electrodes 35a, 35b, 35c, and 35d are provided at four corners of the second main surface 32b, respectively. The via electrodes 34a and 34b are provided in the two via holes 32c, respectively. The outer electrode 35a is electrically connected to the connection electrode 33a by the via electrode 34a, and the outer electrode 35b is electrically connected to the connection electrode 33b by the via electrode 34b. To achieve such electric connection, the outer electrodes 35a and 35b are provided so as to face the connection electrodes 33a and 33b in the Y' direction, respectively.

The connection electrodes 33a and 33b and the outer electrodes 35a to 35d are metal films, and may be, for example, configured such that a molybdenum (Mo) layer, a nickel (Ni) layer, and a gold (Au) layer are laminated in this order from a lower layer to an upper layer. The via electrodes 34a and 34b are, for example, formed by filling the via holes 32c with a metal material such as molybdenum.

The connection electrode 33a is a terminal for electric connection with the connection electrode 16a of the crystal vibration element 10, and the connection electrode 33b is a terminal for electric connection with the connection electrode 16b of the crystal vibration element 10. The outer electrodes 35a to 35d are terminals for electric connection with the mount substrate (not illustrated). In an aspect of the disclosure, the outer electrodes 35a and 35b are input output electrodes to which an input/output signal of the crystal vibration element 10 is supplied, and the outer electrodes 35c and 35d are electrodes to which an input/output signal of the crystal vibration element 10 is not supplied. To the outer electrodes 35c and 35d, an input/output signal of other electronic elements on the mount substrate (not illustrated) is not supplied either. Alternatively, at least one of the outer electrodes 35c and 35d may be an electrode for grounding to which a ground potential is supplied. The shield effect of the lid part 20 can be improved by connecting the lid part 20 to the outer electrode that is an electrode for grounding.

The electrically-conductive holding member 36a electrically connects the connection electrode 16a of the crystal vibration element 10 to the connection electrode 33a of the substrate 30. Similarly, the electrically-conductive holding member 36b electrically connects the connection electrode 16b of the crystal vibration element 10 to the connection electrode 33b of the substrate 30. The electrically-conductive holding members 36a and 36b may be formed, for example, by thermally curing an electrically-conductive adhesive. In an aspect of the disclosure, the crystal vibration element 10 may be supported on the first main surface 32a of the substrate 30 in an excitable manner by the electrically-conductive holding members 36. A short-side end of the crystal piece 11 where the connection electrodes 16a and 16b are provided is a fixed end, and the other ends are free ends. In a case where the electrically-conductive holding members 36a and 36b are not distinguished from each other, the electrically-conductive holding members 36a and 36b are referred to as "electrically-conductive holding members 36."

The sealing frame 37 is an example of a joining member and joins the lid part 20 and the substrate 30 together with the joining member 40. Furthermore, the sealing frame 37 is provided on the first main surface 32a and has a rectangular frame shape provided outside the connection electrodes 33a and 33b so as to surround the connection electrodes 33a and 33b in plan view. This sealing frame 37 is made of a material such as an electrically conductive metal film, for example, a molybdenum (Mo) layer or a laminate of a molybdenum (Mo) layer, a nickel (Ni) layer, and a gold (Au) layer.

The joining member 40 is an example of a joining member and joins the lid part 20 and the substrate 30 together with the sealing frame 37. The joining member 40 is provided on the sealing frame 37. The joining member 40 is, for example, a brazing member and is made of a material such as a gold (Au)-tin (Sn) eutectic alloy. In this way, the lid part 20 and the substrate 30 are metal-joined. According to the metal joining, sealing performance between the lid part 20 and the substrate 30 can be improved. The joining member 40 is not limited to an electrically-conductive material and may be an insulating material such as a glass adhesive material (e.g., low-melting-point glass) or a resin adhesive. This reduces influence of oxidation as compared with a metal, keeps a heating temperature low, and simplifies a production process.

In the crystal vibrator 1 according to an aspect of the disclosure, when an alternating electric field is applied across the pair of excitation electrodes 14a and 14b of the crystal vibration element 10 through the outer electrodes 35a and 35b of the substrate 30, the crystal piece 11 (a central part 11a, which is described below) vibrates in a predetermined vibration mode such as a thickness-shear vibration mode, and resonance characteristics are obtained due to the vibration.

Next, the constituent elements of the crystal vibration element 10 according to an aspect of the disclosure are described in detail with reference to FIGS. 1 and 2. The crystal vibration element 10 according to an aspect of the disclosure includes the AT cut crystal piece 11, and the pair of excitation electrodes 14a and 14b, the pair of connection electrodes 16a and 16b, and the pair of extended electrodes 15a and 15b that are provided on the crystal piece 11.

The crystal piece 11 is an example of a plate-shaped vibrating piece and has a mesa-type structure. This crystal piece 11 has a central part 11a that constitutes a mesa part, a peripheral part 11b whose dimension in the thickness direction is smaller than that of the central part 11a, and a pair of protruding parts 11c that are in contact with side surfaces of the central part 11a and protrude in the thickness direction. The central part 11a, the peripheral part 11b, and the pair of protruding parts 11c are integral with each other. Furthermore, the crystal piece 11 has a first main surface 12a and a second main surface 12b on respective sides in the thickness direction. The first main surface 12a includes a central part main surface 111a, a peripheral part main surface 112a, and a protruding part main surface 113a, which is described below, and the second main surface 12b includes a central part main surface 111b, a peripheral part main surface 112b, and a protruding part main surface 113b, which is described below. In a case where the first main surface 12a and the second main surface 12b are not distinguished from each other, the first main surface 12a and the second main surface 12b are referred to as "main surfaces 12."

In accordance with an aspect of the disclosure, the central part 11a and the protruding parts 11c form a convex shape protruding from both surfaces of the peripheral part 11b in the thickness direction on the XY' plane. The central part 11a, the peripheral part 11b, and the protruding parts 11c have uniform thicknesses. The central part 11a and the protruding parts 11c have the same thickness, and a dimension of the peripheral part 11b in the thickness direction is smaller than that of the central part 11a and the protruding parts 11c. On the XZ' plane, the central part 11a and the peripheral part 11b (crystal piece 11) each have a rectangular shape, and directions of long sides and directions of short sides of these rectangular shapes match each other. The central part 11a is provided on a substantially central side relative to an outer edge of the crystal piece 11, the peripheral part 11b is provided around the central part 11a so as to surround the central part 11a, and the pair of protruding parts 11c are provided at corners of respective ends of a short side of the central part 11a on a positive side in the X-axis direction.

Hereinafter, for convenience of description, on the XZ' plane, a short side of the peripheral part 11b on a side opposite to a side where the connection electrodes 16a and 16b (described below) are provided, that is, on a side opposite to the connection electrodes 16a and 16b is sometimes referred to as a "first side L1," and a short side of the central part 11a on this opposite side, that is, on a side close to the first side is sometimes referred to as a "second side L2."

The central part 11a has a rectangular parallelepiped shape and has the central part main surfaces 111a and 111b, which are XZ' surfaces facing each other, and a side surface 13a perpendicular to the central part main surface 111a. In a case where the central part main surfaces 111a and 111b are not distinguished from each other, the central part main surfaces 111a and 111b are referred to as "central part main surfaces 111." In an aspect of the disclosure, the central part main surface 111 is located on a central side of the crystal piece 11 closer to the first side L1 of the peripheral part 11b when the central part 11a is viewed in plan view. The side surface 13a has a side surface 131a, a side surface 132a, a side surface 133a, and a side surface 134a.

The peripheral part 11b has a plate shape and has the peripheral part main surfaces 112a and 112b, which are XZ' surfaces facing each other, and a side surface 13b perpendicular to the peripheral part main surface 112a. In a case where the peripheral part main surfaces 112a and 112b are not distinguished from each other, the peripheral part main surfaces 112a and 112b are referred to as "peripheral part main surfaces 112." When the peripheral part 11b is viewed in plan view, an outer edge of the peripheral part main surface 112 is an outer edge of the crystal piece 11, and an inner edge of the peripheral part main surface 112 matches an outer edge of the central part main surface 111. That is, the inner edge of the peripheral part main surface 112 is connected to the side surface 13a of the central part 11a.

The protruding parts 11c have a rectangular parallelepiped shape and have the protruding part main surfaces 113a and 113b, which are XZ' surfaces facing each other, and a side surface 13c perpendicular to the protruding part main surface 113a. In a case where the protruding part main surfaces 113a and 113b are not distinguished from each other, the protruding part main surfaces 113a and 113b are referred to as "protruding part main surfaces 113." The pair of protruding parts 11c according to an aspect of the disclosure are provided at corners at both ends of the second side L2 of the central part 11a on a positive side in the X-axis direction, that is, on a side opposite to a side where the connection electrodes 16 are provided in plan view and forms a concave shape together with the rectangular central part 11a. Specifically, each of the protruding parts 11c has a side surface that is in contact with the side surface 131a of the central part 11a where the second side L2 is located and extends from the central part 11a toward the first side L1 of the peripheral part 11b. In other words, the protruding parts 11c are provided between the first side L1 and the second side L2. The protruding part main surface 113 of the protruding parts 11c is a flat surface flush with the central part main surface 111. That is, the protruding parts 11c have the same thickness as the central part 11a in the thickness direction.

The pair of excitation electrodes 14a and 14b are electrodes to which a voltage is applied to vibrate the central part 11a in the thickness-shear mode, and the excitation electrodes 14a and 14b have an identical configuration. The excitation electrodes 14a and 14b are provided on the central part main surfaces 111a and 111b, respectively so as to face each other with the central part 11a interposed there between. In other words, the excitation electrodes 14a and 14b are disposed so that the substantially whole excitation electrodes 14a and 14b overlap each other in plan view.

The connection electrodes 16a and 16b are terminals for electrically connecting the crystal vibration element 10 to the connection electrodes 33a and 33b of the substrate 30. The connection electrode 16a and the connection electrode 16b are aligned along a short side, on a negative side in the X-axis direction, of the peripheral part main surface 112b of the crystal piece 11 (peripheral part 11b). Accordingly, in the crystal vibration element 10, a short side end where the connection electrodes 16a and 16b of the crystal piece 11 are provided is a fixed end, and the other ends are free ends. That is, the crystal vibration element 10 (the crystal piece 11) has a cantilever configuration. Hereinafter, in a case where the connection electrodes 16a and 16b are not distinguished from each other, the connection electrodes 16a and 16b are referred to as "connection electrodes 16," and a side where the connection electrodes 16a and 16b are provided is sometimes referred to as a "connection electrode side."

The extended electrode 15a is an electrode for electrically connecting the excitation electrode 14a to the connection electrode 16a, and the extended electrode 15b is an electrode for electrically connecting the excitation electrode 14b to the connection electrode 16b. Specifically, the extended electrode 15a is provided so as to connect the excitation electrode 14a on the first main surface 12a and the connection electrode 16a on the second main surface 12b, and the extended electrode 15b is provided so as to connect the excitation electrode 14b and the connection electrode 16b on the second main surface 12b. In a case where the extended electrodes 15a and 15b are not distinguished from each other, the extended electrodes 15a and 15b are referred to as "extended electrodes 15."

A material for the excitation electrodes 14, the extended electrodes 15, and the connection electrodes 16 is not limited in particular, and, for example, the excitation electrodes 14, the extended electrodes 15, and the connection electrodes 16 may have a chromium (Cr) layer as a base and a gold (Au) layer on a surface of the chromium layer.

Figure 3A:
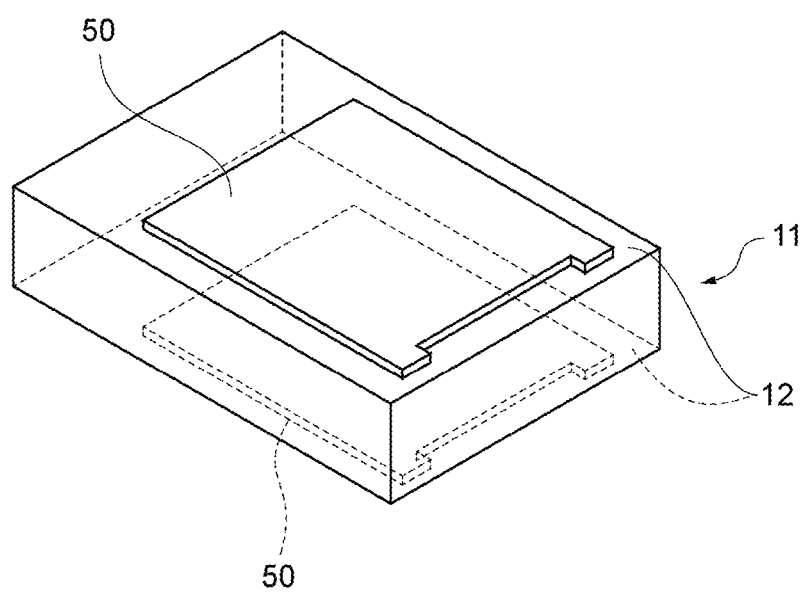
FIG. 3A illustrates a state where a resist has been applied to a crystal piece in accordance with aspects of the present disclosure.
Figure 3B:
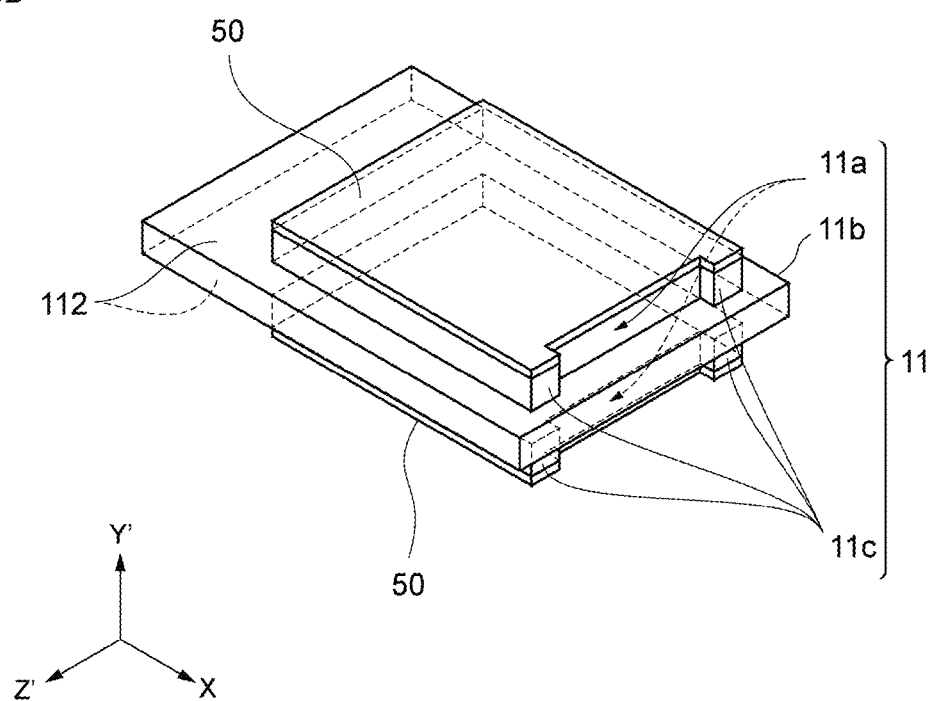
FIG. 3B illustrates a state of the crystal piece obtained after a first etching step and a second etching step in accordance with aspects of the present disclosure.
Figure 3C:
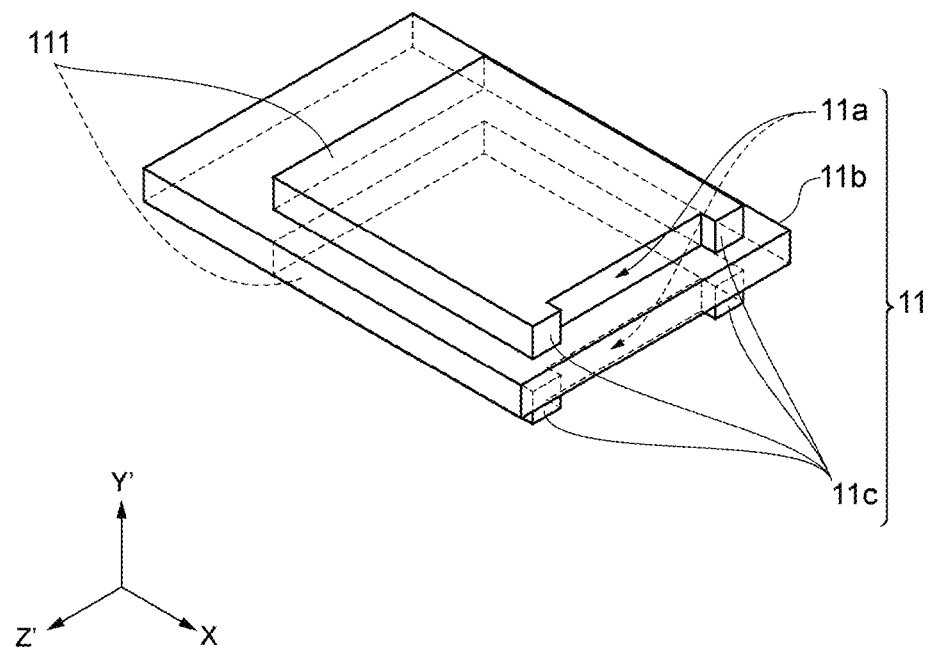
FIG. 3C illustrates a state of the completed crystal piece in accordance with aspects of the present disclosure.

Next, an example of steps for producing the crystal vibration element 10 is described with reference to FIGS. 3A to 3C. This example of steps for producing the crystal vibration element 10 is an example in which the central part 11a, the peripheral part 11b, and the pair of protruding parts 11c are concurrently formed by etching. FIG. 3A illustrates a state where a resist has been applied to the crystal piece 11, FIG. 3B illustrates a state of the crystal piece 11 obtained after a first etching process and a second etching process, and FIG. 3C illustrates a state of the completed crystal piece 11. FIGS. 3A to 3C illustrate a processing method in the thickness direction of the crystal piece 11. In FIGS. 3A to 3C, illustration of the excitation electrodes 14, the extended electrodes 15, and the connection electrodes 16 formed on the crystal piece 11 is omitted.

First, as illustrated in FIG. 3A, a resist film 50 is formed on both main surfaces 12 of the crystal piece 11 cut out from a crystal wafer so as to be located in a part (see FIG. 1) where the central part 11a and the pair of protruding parts 11c are to be formed. A part where the resist film 50 is not formed is a part where the peripheral part 11b (see FIG. 1) is to be formed.

Next, as illustrated in FIG. 3B, the part of the crystal piece 11 on both main surfaces 12 where the resist film 50 is not formed is removed by etching to form the peripheral part 11b. Meanwhile, the part where the resist film 50 is formed, that is, the central part 11a and the pair of protruding parts 11c remains in a convex shape without being removed by the etching. The step for forming the peripheral part 11b is an example of a first etching step, and the step for forming the central part 11a and the pair of protruding parts 11c is an example of a second etching step.

Such etching may make it possible to concurrently form the central part 11a, the peripheral part 11b, and the pair of protruding parts 11c, thereby enabling efficient processing. Furthermore, the central part 11a and the protruding parts 11c on both sides in the thickness direction may be processed by one etching processing, and therefore an accurate thickness of the crystal piece 11 can be obtained.

The etching according to an aspect of the present disclosure may be, for example, wet etching. In this case, hydrofluoric acid may be used or a mixed liquid, for example, made up of hydrofluoric acid and ammonium fluoride may be, for example, used. The crystal piece 11 that has been subjected to the etching processing is configured such that the central part 11a and the protruding parts 11c covered with the resist film 50 are formed in a convex shape, as illustrated in FIG. 3B.

After the etching, the remaining resist film 50 that covers the central part 11a and the protruding parts 11c of the crystal piece 11 is removed, as illustrated in FIG. 3C. In this way, the crystal piece 11 is produced. Then, for example, metal films having a chromium (Cr) layer as a base and a gold (Au) layer on a surface of the chromium layer are formed on parts such as the central part main surface 111 of the central part 11a of the crystal piece 11. These metal films constitute the excitation electrodes 14, the extended electrodes 15, and the connection electrodes 16. After the formation of the metal films, production of the crystal vibration element 10 is completed.

Figure 4A:
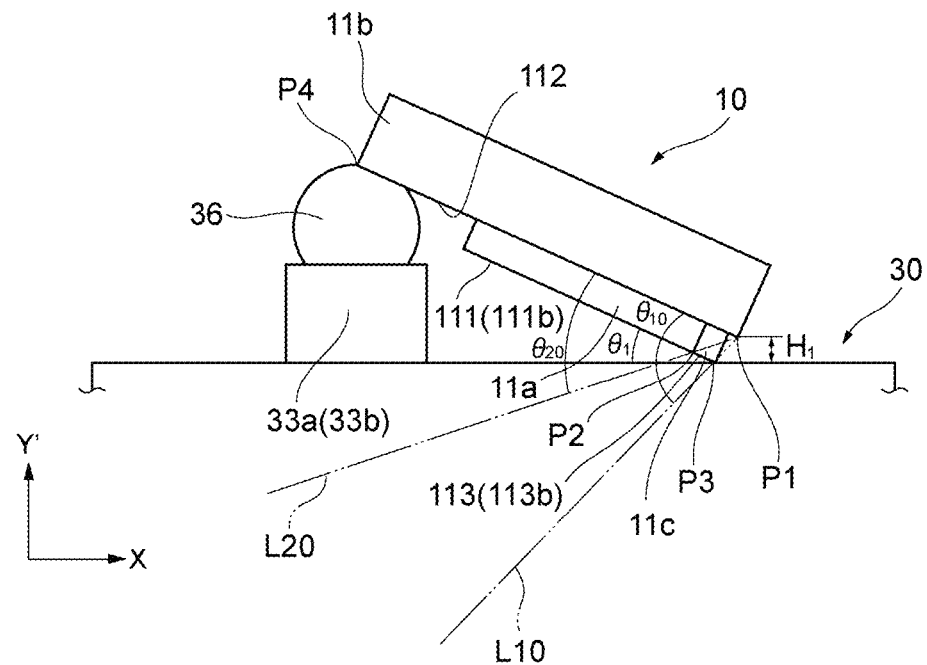
FIG. 4A illustrates a state of a central part in a case where protruding parts make contact with a substrate in accordance with aspects of the present disclosure.
Figure 4B:
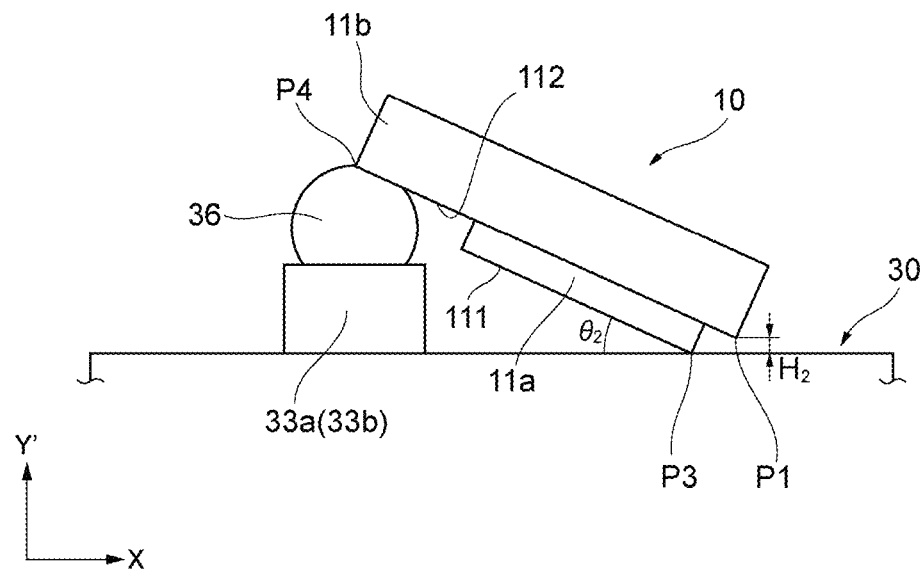
FIG. 4B is a view for explaining a state of the central part in a case where protruding parts in accordance with aspects of the present disclosure.

Next, the protruding parts 11c in a case where the crystal vibration element 10 is inclined toward the substrate 30 is described in detail with reference to FIGS. 4A and 4B. FIGS. 4A and 4B are schematic views illustrating a state in a case where the crystal vibration element 10 is inclined toward the substrate 30, FIG. 4A illustrates a state of the central part 11a in a case where the protruding parts 11c make contact with the substrate 30, and FIG. 4B illustrates a state of the central part 11a in a case where the protruding parts 11c are not employed. Since the same principle holds both in a case where the protruding parts 11c makes contact with the lid part 20 and a case where the protruding parts 11c makes contact with the substrate 30, illustration of the central part 11a and the protruding parts 11c that protrude from the peripheral part 11b toward the lid part 20, the lid part 20, other members such as wires is omitted in FIGS. 4A and 4B. Hereinafter, on the XY' plane, an end point of the crystal vibration element 10 on the connection electrode side on which the connection electrodes 16 are provided in a case where the crystal vibration element 10 is inclined is referred to as a "support point P4."

Since the protruding parts 11c according to an aspect of the present disclosure may have the same thickness as the central part 11a as described above, the protruding part main surface 113b of the protruding parts 11c and the central part main surface 111b of the central part 11a constitute a straight line on the XY' plane. Since the protruding parts 11c are provided on a side opposite to the support point P4 relative to the central part 11a, that is, on a side close to the free end of the crystal vibration element 10, a straight line part corresponding to the protruding part main surface 113b of the protruding parts 11c is located closer to the free end side than a straight line part corresponding to the central part main surface 111b of the central part 11a on the XY' plane. Furthermore, a distance from the support point P4 to the substrate 30 is a constant distance determined by dimensions of the electrically-conductive holding members 36 and the connection electrodes 33a and 33b on the substrate 30 side in the thickness direction. Accordingly, on the XY' plane, the central part 11a on a support point P4 side relative to the protruding parts 11c does not make contact with the substrate 30 in a case where the crystal vibration element 10 is inclined toward the substrate 30 while being supported on the connection electrode side, for example, due to a variation in fixation state of the crystal vibration element 10 or deformation of the substrate 30 and the protruding parts 11c make contact with the substrate 30, as illustrated in FIG. 4A.

Meanwhile, if the protruding parts 11c are not employed, the central part 11a makes contact with the substrate 30 in a case where the crystal vibration element 10 is inclined toward the substrate 30 while being supported on the connection electrode side, as illustrated in FIG. 4B.

As described above, in a case where the crystal vibration element 10 is inclined toward the substrate 30 while being supported on the connection electrode side, the protruding parts 11c make contact with the substrate 30, and as a result, it may be possible to prevent the central part 11a from making contact with the substrate 30. This also makes it possible to prevent the excitation electrode 14 provided on the central part main surface 111 of the central part 11a from making contact with the substrate 30. As a result, it may be possible to lessen inhibition of free vibration of the crystal vibration element 10 due to contact of the central part 11a and the excitation electrodes 14 with the substrate 30 and influence of the inhibition on vibration characteristics of the crystal vibration element 10.

Furthermore, since the protruding parts 11c according to an aspect of the present disclosure are provided at corners of the rectangular central part 11a so as to be integral with the central part 11a, it may be possible to provide the central part main surfaces 111 having a larger area and provide the excitation electrodes 14 having a larger area on the central part main surfaces 111 having such a large area, as compared with a case where the protruding parts 11c of the crystal piece 11 having a similar area are provided separately from the central part 11a. This may provide a wide excitation region of the excitation electrodes 14 even in a case where the crystal vibration element 10 has a small size, thereby suppressing an increase in equivalent series resistance value of the crystal vibration element 10 caused by a reduction in excitation region.

Since the protruding parts 11c according to an aspect of the present disclosure are provided at corners of the rectangular central part on the XZ' plane, that is, at corners most remote from a maximum part of vibratory displacement energy that diffuses in an oval shape, it is possible to minimize a decrease in piezoelectric effect caused by contact of the protruding parts 11c with the substrate 30.

Therefore, according to the protruding parts 11c according to an aspect of the present disclosure, it is possible to realize a reduction in size of the crystal vibration element 10 and obtain good vibration characteristics.

Although a case where the protruding parts 11c are provided symmetrically at two corners of the central part 11a has been described above, the protruding parts 11c can employ any configuration, any number, and any combination as long as the protruding parts 11c make contact with the substrate 30 or the lid part 20 and thereby prevent the central part 11a from making contact with the substrate 30 or the lid part 20 in a case where the crystal vibration element 10 is inclined toward the substrate 30 or the inner surface 24 of the lid part 20 while being supported on the connection electrode side. The following describes configuration conditions which may be necessary for the protruding parts 11c to prevent the central part 11a from making contact with the substrate 30 or the lid part 20 with reference to FIGS. 4A and 4B and then describes specific modifications of the protruding parts 11c with reference to FIGS. 5A to 6B. Hereinafter, the "case where the crystal vibration element 10 is inclined toward the substrate 30 or the inner surface 24 of the lid part 20 while being supported on the connection electrode side" is referred to as a "case where the crystal vibration element 10 is inclined," and "the protruding parts 11c prevents the central part 11a from making contact with the substrate 30 or the lid part 20" is referred to as "the central part 11a is prevented from making contact with the substrate 30 or the like."

First, a configuration condition is considered from a difference in positional relationship of the crystal vibration element 10 between a case where the protruding parts 11c are provided and a case where the protruding parts 11c are not provided. In a case where the crystal vibration element 10 is inclined, a first angle θ1 illustrated in FIG. 4A formed between the central part main surface 111 and the substrate 30 in a case where the protruding parts 11c make contact with the substrate 30 is smaller than a second angle θ2 illustrated in FIG. 4B formed between the central part main surface 111 and the substrate 30 in a case where the protruding parts 11c are not provided and the central part 11a makes contact with the substrate or the lid part. Therefore, the crystal vibration element 10 having the protruding parts 11c that meet such a condition may prevent the central part 11a from making contact with the substrate 30 or the like in a case where the crystal vibration element 10 is inclined.

Furthermore, a configuration condition is considered from a difference in positional relationship of the free end of the crystal vibration element 10 between a case where the protruding parts 11c are provided and a case where the protruding parts 11c are not provided. In a case where the crystal vibration element 10 is inclined, a first distance H1 illustrated in FIG. 4A from a part of the peripheral part 11b closest to the substrate 30 to the substrate 30 in a case where the protruding parts 11c make contact with the substrate 30 is larger than a second distance H2 illustrated in FIG. 4B from a part of the peripheral part 11b closest to the substrate 30 to the substrate 30 in a case where the protruding parts 11c are not provided and the central part 11a makes contact with the substrate 30. Therefore, the crystal vibration element 10 having the protruding parts 11c that meet such a condition may prevent the central part 11a from making contact with the substrate 30 or the like in a case where the crystal vibration element 10 is inclined.

Furthermore, a configuration condition is considered from a relationship among the free end of the crystal vibration element 10, the protruding parts 11c, and the central part 11a. For convenience of description, an end point of the peripheral part 11b on a side opposite to the connection electrode side is referred to as a "first end point P1," an end point of the central part 11a on the side opposite to the connection electrode side is referred to as a "second end point P2," and an end point of the protruding parts 11c on the side opposite to the connection electrode side is referred to as a "third end point P3."

In this case, as illustrated in FIG. 4A, on the XZ' plane, a first virtual angle θ10 formed between a first virtual line L10 connecting the first end point P1 and the third end point P3 of the crystal vibration element 10 and the peripheral part main surface 112 of the peripheral part 11b is larger than a second virtual angle θ20 formed between a second virtual line L20 connecting the first end point P1 and the second end point P2 and the peripheral part main surface 112 of the peripheral part 11b. Therefore, the crystal vibration element 10 having the protruding parts 11c that meet such a condition can prevent the central part 11a from making contact with the substrate 30 or the like in a case where the crystal vibration element 10 is inclined.

Next, modifications of the protruding parts 11c are described with reference to FIGS. 5A to 6B. FIGS. 5A to 6B are views for explaining a configuration of protruding parts 11c of a crystal vibration element 10 according to another aspect of the disclosure. In the description of the protruding parts 11c according to other aspects of the disclosure, description of constituent elements identical to those in the above disclosure is omitted, and only different constituent elements are described. In FIGS. 5A to 6B, illustration of excitation electrodes 14, extended electrodes 15, and connection electrodes 16 formed on the crystal vibration element 10 is omitted.

Figure 5A:
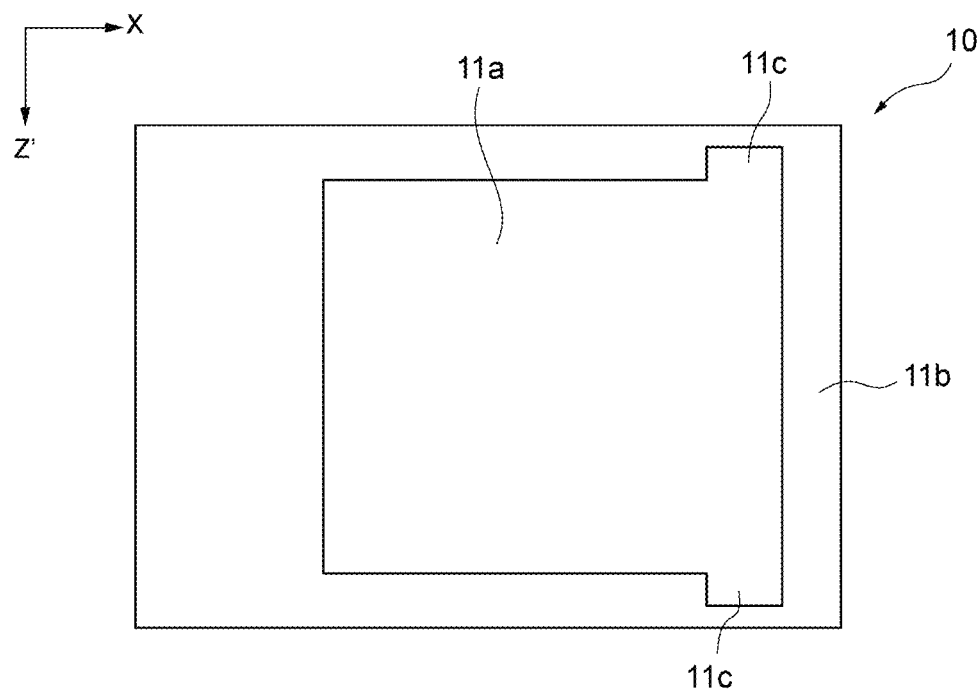
FIG. 5A is a plan view for explaining an example of protruding parts of a crystal vibration element in accordance with aspects of the present disclosure.

Although a configuration in which the pair of protruding parts 11c make contact with the side surface 131a (see FIGS. 1 and 2) of the central part 11a opposite to the connection electrodes 16, are isolated from each other, and have the same thickness as the central part 1 1ain the thickness direction has been described in the above disclosure, this configuration is not restrictive. For example, it is possible to employ a protruding part 11c that has a rectangular planar shape larger than a dimension of the central part 11a in the Z'-axis direction, as illustrated in FIG. 5A. In this case, the rectangular protruding part 11c makes contact with the side surface 131a (see FIGS. 1 and 2) of the central part 11a. Such a protruding part 11c can improve strength of the protruding part 11c itself and increase an area of the central part 11a.

Furthermore, for example, a pair of protruding parts 11c illustrated in FIG. 5B have a first part that extends from a corner of the central part 11a toward the first side L1 of the peripheral part 11b along a direction opposite to a side where the connection electrodes 16 (see FIGS. 1 and 2) are provided and a second part that extends from the corner of the central part 11a toward a side L3 crossing the first side L1 of the peripheral part 11b along a direction crossing the direction opposite to the side where the connection electrodes 16 are provided, unlike the protruding parts 11c according to an aspect of the present disclosure. The configuration in which the protruding parts 11c are provided at corners encompasses not only the configuration in which the protruding parts 11c extend from the corners of the central part 11a toward the first side L1 of the peripheral part 11b according to an aspect of the present disclosure, but also a configuration in which the protruding parts 11c extend from the corners of the central part 11a toward the side L3 crossing the first side L1 of the peripheral part 11b, a configuration in which the protruding parts 11c have both a part that extends from the corners of the central part 11a toward the first side L1 of the peripheral part 11b and a part that extends from the corners of the central part 11a toward the side L3 crossing the first side L1 of the peripheral part 11b so as to surround the corners as illustrated in FIG. 5B, and a configuration in which the protruding parts 11c are provided close to the corners of the central part 11a. Such protruding parts 11c can prevent the central part 11a from making contact with the substrate 30 or the like in a case where the crystal vibration element 10 is inclined in various directions.

Furthermore, for example, a pair of protruding parts 11c illustrated in FIG. 5C each has a protrusion body and a connecting part 111c connecting the protrusion body and the central part 11a in plan view, unlike the protruding parts 11c according to an aspect of the present disclosure. Such protruding parts 11c can make parts where the protruding parts 11c and the central part 11a are connected thin, thereby lessening influence on a decrease in piezoelectric effect caused by contact of the protruding parts 11c with the substrate 30 or the like.

Figure 6A:
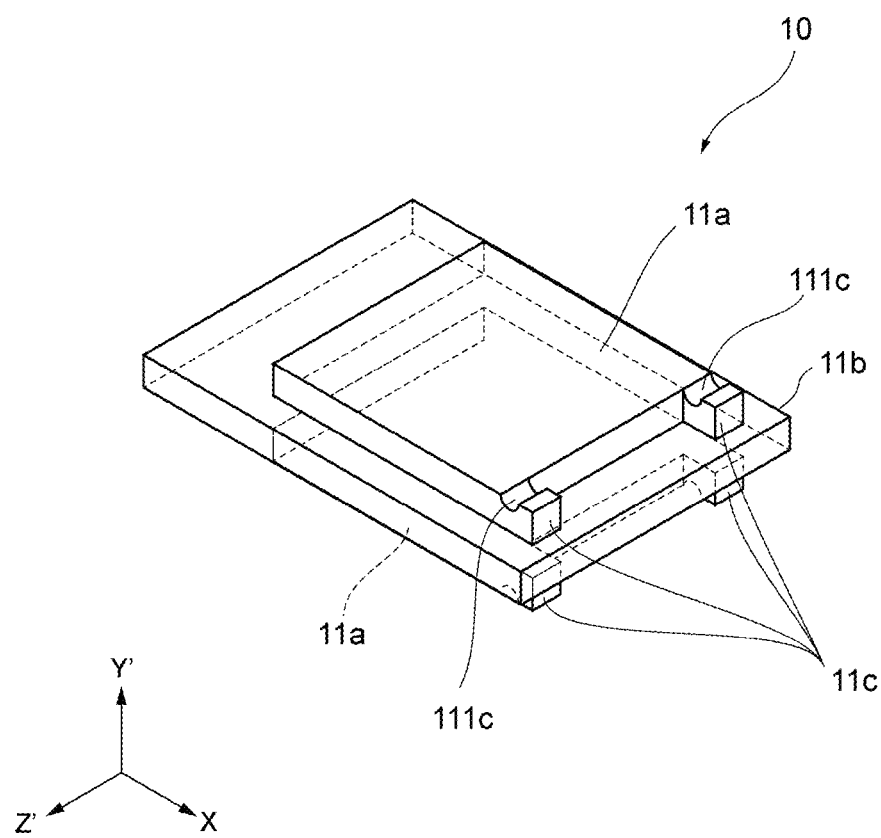
FIG. 6A is a perspective view for explaining another example of protruding parts of a crystal vibration element in accordance with aspects of the present disclosure.

Furthermore, for example, a connecting part 111c of each of a pair of protruding parts 11c illustrated in FIG. 6A has a groove, unlike the protruding parts 11c according to an aspect of the present disclosure. Such protruding parts 11c make parts where the protruding parts 11c and the central part 11a are connected narrow, thereby lessening influence on a decrease in piezoelectric effect caused by contact of the protruding parts 11c with the substrate 30 or the like.

Figure 6B:
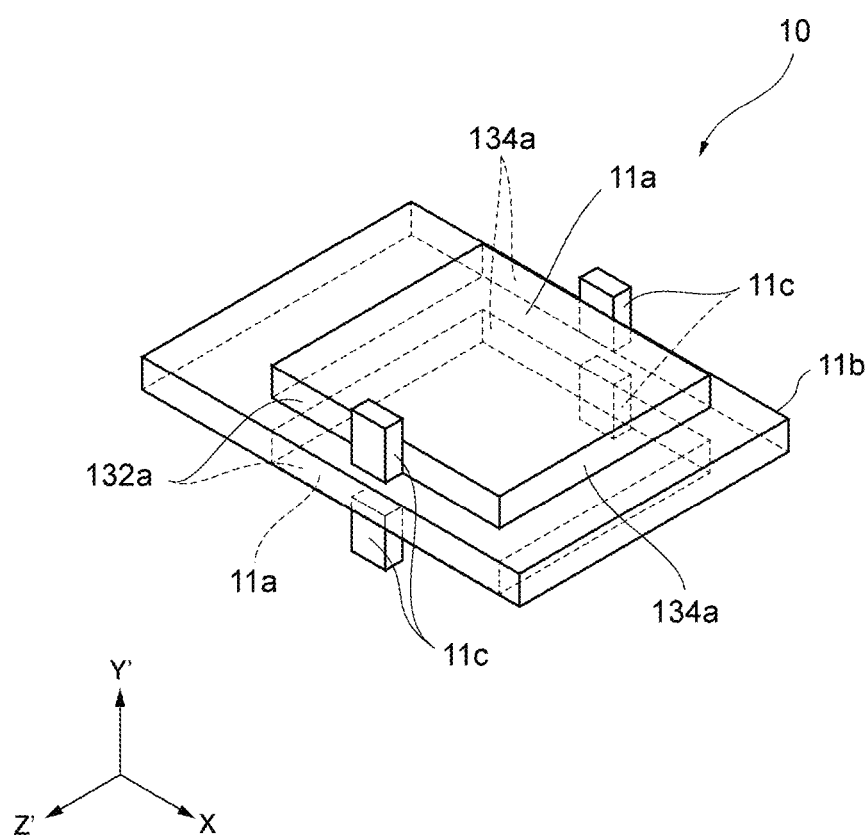
FIG. 6B is a perspective view for explaining another example of protruding parts of a crystal vibration element in accordance with aspects of the present disclosure.

Furthermore, for example, a pair of protruding parts 11c illustrated in FIG. 6B are provided so as to be in contact with corners, specifically, side surface 132a and 134a close to the corners, unlike the protruding parts 11c according to an aspect of the present disclosure. Such protruding parts 11c allows the central part 11a to have a sufficient dimension in a direction along a direction opposite to a side where the connection electrodes 16 are provided, thereby suppressing an increase in equivalent series resistance value of the crystal vibration element 10.

Although a pair of protruding parts 11c is used in the above disclosure and modifications, any number of protruding parts 11c may be provided according to need. In a case where two or more protruding parts 11c are employed, the protruding parts 11c may have different heights, positions, combinations, and the like. In a case where the plurality of protruding parts 11c are provided, it may only be necessary that at least one protruding part can prevent the central part 11a from making contact with the substrate 30 or the like in a case where the crystal vibration element 10 is inclined.

The crystal vibrator 1 according to an aspect of the present disclosure includes the crystal vibration element 10, which includes the crystal piece 11 having the central part 11a and the peripheral part 11b whose dimension in a thickness direction may be smaller than the central part 11a, the pair of excitation electrodes 14 provided on the central part main surfaces 111 on both sides of the central part 11a in the thickness direction, and the pair of connection electrodes 16 electrically connected to the pair of excitation electrodes 14, respectively and provided on the peripheral part; the substrate 30 connected to the connection electrodes 16 of the crystal vibration element 10 with the electrically-conductive holding member 36 interposed there between on one side in the thickness direction so as to support the crystal vibration element 10 in an excitable manner; and the lid part 20 that covers the crystal vibration element 10 on the other side in the thickness direction, wherein the crystal piece 11 has at least one protruding part 11c provided in contact with the central part 11a when the central part main surfaces 111 of the crystal vibration element 10 are viewed in plan view, and the at least one protruding part 11c protrudes in the thickness direction in a position where the at least one protruding part 11c makes contact with the substrate 30 or the lid part 20 in a case where the crystal vibration element 10 is inclined toward the substrate 30 or the lid part 20 while being supported on a side where the pair of connection electrodes 16 are provided.

According to the above configuration, a reduction in size of the vibrator can be obtained with good vibration characteristics.

In the above configuration, the protruding part 11c does not contact the substrate 30 nor the lid part 20 in a case where the central part main surfaces 111 of the crystal vibration element 10 are parallel with at least a part of the substrate 30 or the lid part 20.

According to the above configuration, it may be possible to lessen inhibition of free vibration of the crystal vibration element and influence of the inhibition on vibration of the crystal vibration element.

In the above configuration, on a cross section in the thickness direction, the peripheral part 11b has a first end point P1 on a side opposite to the side where the pair of connection electrodes 16 are provided, the central part 11a has a second end point P2 on the side opposite to the side where the pair of connection electrodes 16 are provided, and the at least one protruding part 11c has a third end point P3 on the side opposite to the side where the pair of connection electrodes 16 are provided; and a first virtual angle formed between a first virtual line L1 connecting the first end point P1 and the third end point P3 and the peripheral part 11b is larger than a second virtual angle formed between a second virtual line L2 connecting the first end point P1 and the second end point P2 and the peripheral part 11b.

According to the above configuration, it may be possible to suppress inhibition of vibration caused by the excitation electrodes.

In the above configuration, the at least one protruding part 11c is provided on a periphery of the central part 11a on a side different from the side where the pair of connection electrodes 16 are provided when the central part main surfaces 111 of the crystal vibration element 10 are viewed in plan view.

According to the above configuration, it may be possible to realize a reduction in size of the vibrator and suppression of inhibition of vibration caused by the excitation electrodes.

In the above configuration, the at least one protruding part 11c is provided on the periphery of the central part 11a on a side opposite to the side where the pair of connection electrodes 16 are provided when the central part main surfaces 111 of the crystal vibration element 10 are viewed in plan view.

According to the above configuration, it may possible to realize a reduction in size of the vibrator and suppress inhibition of vibration caused by the excitation electrodes.

In the above configuration, the at least one protruding part 11c is two or more protruding parts 11c; and the two or more protruding parts 11c are provided apart from each other when the central part main surfaces 111 of the crystal vibration element 10 are viewed in plan view.

According to the above configuration, it may be possible to suppress inhibition of vibration caused by the excitation electrodes with certainty.

Furthermore, the at least one protruding part 11c protrudes so as to have a thickness equal to or larger than a thickness of the central part 11a in the thickness direction.

According to the above configuration, it may be possible to lessen inhibition of free vibration of the crystal vibration element and influence of the inhibition on vibration of the crystal vibration element.

In the above configuration, when the central part main surfaces 111 of the crystal vibration element 10 are viewed in plan view, at least a part of the at least one protruding part 11c is located on the periphery of the central part 11a on a side opposite to the side where the pair of connection electrodes 16 are provided, and the at least the part protrudes so as to have a thickness equal to or larger than a thickness of the central part 11a in the thickness direction.

According to the above configuration, it may be possible to realize a reduction in size of the vibrator and suppress inhibition of vibration caused by the excitation electrodes.

In the above configuration, when the central part main surfaces 111 of the crystal vibration element 10 are viewed in plan view, at least one protruding part 11c is provided at a corner on a periphery of the central part 11a in a direction opposite to the side where the pair of connection electrodes 16 are provided, and the at least one protruding part 11c includes a first part that extends from the corner toward a periphery of the peripheral part 11b along the opposite direction and has at least a part having a same thickness as the central part 11a and/or a second part that extends from the corner toward the periphery of the peripheral part 11b along a direction crossing the opposite direction and has at least a part thicker than the central part 11a.

In the above configuration, when the central part main surfaces 111 of the crystal vibration element 10 are viewed in plan view, the central part 11a has a rectangular shape, and the at least one protruding part 11c is provided at a corner of the rectangular shape.

According to the above configuration, a decrease in piezoelectric effect can be minimized. In the above configuration, the at least one protruding part 11c is provided at least on a side of the crystal piece 11 that faces the substrate 30.

According to the above configuration, it may be possible to suppress inhibition of vibration of the excitation electrodes due to contact with the substrate. In the above configuration, the crystal piece 11 is made of crystal.

According to the above configuration, it is possible to realize a reduction in size of the crystal vibrator and obtain good vibration characteristics.

A method for producing the crystal vibration element 10 according to an aspect of the present disclosure is a method for producing the crystal vibration element 10 including the crystal piece 11 having the central part 11a and the peripheral part 11b whose dimension in a thickness direction is smaller than the central part 11a, the pair of excitation electrodes 14 provided on the central part main surfaces 111 on both sides of the central part 11a in the thickness direction, and the pair of connection electrodes 16 electrically connected to the pair of excitation electrodes 14, respectively and provided on the peripheral part 11b, the method including: a first etching step of etching the substrate 30 to form a first part having the central part 11a and the peripheral part 11b; and a second etching step of etching the first part to form at least one protruding part 11c that is in contact with the central part 11a when the central part main surfaces 111 of the crystal vibration element 10 are viewed in plan view.

According to the above method, it may be possible to realize a reduction in size of the crystal vibrator and obtain good vibration characteristics.

In the above method, in the first etching step, the central part 11a is formed so as to have a rectangular shape when the central part main surfaces 111 of the crystal vibration element 10 are viewed in plan view; and in the second etching step, the at least one protruding part 11c is formed at a corner of the rectangular central part 11a.

According to the above method, the vibration element can be processed by a simple method. In the above method, the first etching step and the second etching step are concurrently performed.

According to the above method, the vibration element may be processed efficiently.

The crystal vibration element 10 according to an aspect of the present disclosure includes the crystal piece 11 having the central part 11a and the peripheral part 11b whose dimension in a thickness direction is smaller than the central part 11a; the pair of excitation electrodes 14 provided on the central part main surfaces 111 on both sides of the central part 11a in the thickness direction; and the pair of connection electrodes 16 electrically connected to the pair of excitation electrodes 14, respectively and provided on the peripheral part, wherein the crystal piece 11 has at least one protruding part 11c provided in contact with the central part 11a when the central part main surfaces 111 of the crystal vibration element 10 are viewed in plan view, on a cross section in the thickness direction, the peripheral part 11b has a first end point P1 on a side opposite to a side where the pair of connection electrodes 16 are provided, the central part 11a has a second end point P2 on the side opposite to the side where the pair of connection electrodes 16 are provided, and the at least one protruding part 11c has a third end point P3 on the side opposite to the side where the pair of connection electrodes 16 are provided, and a first virtual angle formed between a first virtual line L1 connecting the first end point P1 and the third end point P3 and the peripheral part 11b is larger than a second virtual angle formed between a second virtual line L2 connecting the first end point P1 and the second end point P2 and the peripheral part 11b.

According to the above configuration, a reduction in size of the crystal vibrator can be provided with good vibration characteristics.

In the above configuration, the at least one protruding part 11c is provided on the side opposite to the side where the pair of connection electrodes 16 are provided and protrudes so as to have a thickness equal to or larger than a thickness of the central part 1 lain the thickness direction.

According to the above configuration, it may be possible to realize a reduction in size of the vibrator and suppress inhibition of vibration caused by the excitation electrodes.

In the above configuration, the at least one protruding part 11c is two or more protruding parts 11c; and the two or more protruding parts 11c are provided apart from each other when the central part main surfaces 111 of the crystal vibration element 10 are viewed in plan view.

According to the above configuration, it may be possible to suppress inhibition of vibration caused by the excitation electrodes with certainty. It is also noted that=the present disclosure is not limited to the above aspects and can be modified in various ways. Modifications according to the present disclosure are described below.

Although the crystal piece 11, which is an example of a vibrating piece, is an AT cut crystal piece whose long side is parallel with the X axis and whose short side is parallel with the Z' axis in the above disclosure, the above configuration is not restrictive. For example, the crystal piece 11 may be an AT cut crystal piece whose long side is parallel with the Z' axis and whose short side is parallel with the X axis. Alternatively, the crystal piece 11 may be a crystal piece cut in a way (for example, BT cut) different from AT cut, as long as the crystal piece 11 vibrates mainly in a thickness-shear mode. Note, however, that AT cut crystal piece, which can obtain extremely high frequency stability in a wide temperature range, is most preferable. The vibrating piece may be any of other materials whose main vibration is thickness-shear vibration instead of the crystal piece 11.

Although the crystal piece 11, the central part main surface 111, and the excitation electrodes 14 each have a rectangular shape having long sides and short sides when the crystal vibration element 10 is viewed in plan view in the above disclosure, the crystal piece 11, the central part main surface 111, and the excitation electrodes 14 may each have a rectangular shape whose four sides have equal lengths, that is, a square shape. The crystal piece 11, the central part main surface 111, and the excitation electrodes 14 may each have a substantially rectangular shape. The substantially rectangular shape encompasses a shape obtained, for example, by rounding or chamfering four corners (not right angles), a shape obtained by curving one or some sides, or a shape obtained by curving all sides of the outer edge of the crystal piece 11 and the planar shapes of the central part main surface 111 and the excitation electrodes 14. Furthermore, the crystal piece 11, the central part main surface 111, and the excitation electrodes 14 may each have a shape such as a substantially circular shape or a substantially oval shape.

Although the planar shape of the excitation electrodes 14 is smaller than the planar shape of the central part main surface 111 when the crystal vibration element 10 is viewed in plan view in the above disclosure, the planar shape of the excitation electrodes 14 may be identical to the planar shape of the central part main surface 111 or may be larger than the planar shape of the central part main surface 111.

Although the side surface 13a of the central part 11a of the crystal piece 11 is a surface that forms a right angle with respect to the XZ' plane in the above disclosure, this angle is not limited in particular. For example, the angle between the side surface 13 and the XZ' plane may be inclined to a predetermined angle depending on crystal orientation of the crystal. Such an inclined angle can be formed, for example, by wet etching. Note that the thickness of the peripheral part 11b in the Y'-axis direction may be identical.

Although the peripheral part 11b has a uniform thickness in the above disclosure, the thickness of the peripheral part 11b may be non-uniform. For example, the peripheral part 11b may have a step-like configuration, an inclination configuration, or the like in which a thickness dimension gradually becomes smaller from a central part to an outer edge part.

Although an example of the connection electrodes 33a and 33b, the via electrodes 34a and 34b, and the outer electrode 35a to d of the substrate 30 has been described in the above disclosure, the configurations of the connection electrodes 33a and 33b, the via electrodes 34a and 34b, and the outer electrode 35a to d of the substrate 30 are not limited to the above example and can be modified in various ways. For example, the number of outer electrodes is not limited to four. For example, two outer electrodes may be disposed diagonally. Furthermore, the outer electrodes need not be disposed at corners, and may be provided on any side surface of the substrate 30 excluding the corners. In this case, as has been described above, a cutout side surface may be formed by cutting a part of a side surface in a cylindrical curved surface, and the outer electrodes may be formed on this side surface excluding the corners. Furthermore, other outer electrodes 35c and 35d, which are dummy electrodes, need not be formed. Furthermore, the substrate 30 may be provided with an extended electrode formed from the first main surface 32a to the second main surface 32b so that electric conduction there between is achieved.

Although the substrate 30 is a flat plate and the lid part 20 has a concave shape in the above disclosure, the shapes of the substrate 30 and the lid part 20 are not limited in particular, provided that the crystal vibration element 10 can be contained in an internal space. For example, the substrate 30 may have a concave shape, and the lid part 20 may have a flat plate shape. The substrate 30 and the lid part 20 may hold the crystal vibration element 10 by sandwiching the crystal vibration element 10 between the substrate 30 and the lid part 20 instead of containing the crystal vibration element 10 in the internal space.

Although the etching according to the production method is wet etching in the above disclosure, the etching may be dry etching. Furthermore, for example, the production method may use both dry etching and wet etching, for example, use dry etching in the first etching step and use wet etching in the second etching step.

In general, the description of the aspects disclosed should be considered as being illustrative in all respects and not being restrictive. The scope of the present invention is shown by the claims rather than by the above description, and is intended to include meanings equivalent to the claims and all changes in the scope. While preferred aspects of the invention have been described above, it is to be understood that variations and modifications will be apparent to those skilled in the art without departing from the scope and spirit of the invention.

DESCRIPTION OF REFERENCE SYMBOLS 1 crystal vibrator
10 crystal vibration element
11 crystal piece
11a central part
11b peripheral part
11c protruding part
12a first main surface
12b second main surface
14, 14a, 14b excitation electrode
16, 16a, 16b connection electrode
20 lid part
30 substrate
111, 111a, 111b central part main surface

The invention claimed is:

1. A vibrator comprising:
a vibration element including a vibrating piece having a central portion and a peripheral portion, wherein a thickness of the peripheral portion is smaller than a thickness of the central portion;
a pair of excitation electrodes disposed on a first side and a second side of a main surface of the central portion, respectively;
a pair of connection electrodes disposed on the peripheral portion and electrically connected to the pair of excitation electrodes;
a substrate configured to be connected to the pair of connection electrodes via an electrically-conductive holding member interposed therebetween and configured to support the vibration element in an excitable manner; and
a lid configured to cover the vibration element;
wherein the vibrating piece includes a protruding part provided in contact with the central portion when the main surface of the central portion is viewed in a plan view, and
wherein the protruding part is configured to contact the substrate or the lid when the vibration element is inclined toward the substrate or the lid while being supported on a side where the pair of connection electrodes are disposed.

2. The vibrator according to claim 1, wherein, when the main surface of the central portion is parallel with the substrate or the lid, the protruding part does not contact the substrate or the lid.

3. The vibrator according to claim 1, wherein:
on a cross section in a thickness direction, the peripheral portion has a first end point on a side opposite to the side where the pair of connection electrodes are disposed, the central portion has a second end point on the side opposite to the side where the pair of connection electrodes are disposed, and the protruding part has a third end point on the side opposite to the side where the pair of connection electrodes are disposed; and
a first virtual angle formed between a first virtual line connecting the first end point and the third end point, and the peripheral portion is larger than a second virtual angle formed between a second virtual line connecting the first end point and the second end point and the peripheral portion.

4. The vibrator according to claim 1, wherein, when the main surface of the central portion is viewed in the plan view, the protruding part is provided on a periphery of the central portion on a side different from the side where the pair of connection electrodes are disposed.

5. The vibrator according to claim 4, wherein, when the main surface of the central portion is viewed in the plan view, the protruding part is provided on the periphery of the central portion on a side opposite to the side where the pair of connection electrodes are disposed.

6. The vibrator according to claim 5, wherein the protruding part is two protruding parts, and wherein, when the main surface of the central portion is viewed in the plan view, the two protruding parts are provided apart from each other.

7. The vibrator according to claim 6, wherein the two protruding parts have a thickness equal to or larger than the thickness of the central portion.

8. The vibrator according to claim 1, wherein the protruding part has a thickness equal to or larger than the thickness of the central portion.

9. The vibrator according claim 1, wherein, when the main surface of the central portion is viewed in the plan view, at least a portion of the protruding part is located on a periphery of the central portion on a side opposite to the side where the pair of connection electrodes are disposed.

10. The vibrator according claim 1, wherein, when the main surface of the central portion is viewed in the plan view, the protruding part is provided at a corner on a periphery of the central portion in a direction opposite to the side where the pair of connection electrodes are disposed.

11. The vibrator according to claim 10, wherein the protruding part includes a first part that extends from the corner toward a periphery of the peripheral portion along the direction opposite and having a thickness equal to the central portion, or a second part that extends from the corner toward the periphery of the peripheral portion along a direction crossing the direction opposite and having a thickness greater than the central portion.

12. The vibrator according claim 1, wherein, when the main surface of the central portion is viewed in the plan view, the central portion has a rectangular shape, and the protruding part is provided at a corner of the rectangular shape.

13. The vibrator according to claim 1, wherein the protruding part is provided on a side of the vibrating piece that faces the substrate.

14. The vibrator according to claim 1, wherein the vibrating piece is made of crystal.

15. A vibration element comprising:
a vibrating piece having a central portion and a peripheral portion, wherein a thickness of the peripheral portion is smaller than a thickness of the central portion;
a pair of excitation electrodes provided on a first side and a second side of a main surface of the central portion, respectively;
a pair of connection electrodes provided on the peripheral portion and electrically connected to the pair of excitation electrodes,
wherein the vibrating piece includes a protruding part provided in contact with the central portion when central portion main surfaces are viewed in a plan view,
wherein, on a cross section in a thickness direction, the peripheral portion has a first end point on a side opposite to a side where the pair of connection electrodes are provided, the central portion has a second end point on the side opposite to the side where the pair of connection electrodes are provided, and the protruding part has a third end point on the side opposite to the side where the pair of connection electrodes are provided, and wherein a first virtual angle formed between a first virtual line connecting the first end point and the third end point and the peripheral portion is larger than a second virtual angle formed between a second virtual line connecting the first end point and the second end point and the peripheral part.

16. The vibration element according to claim 15, wherein the protruding part is provided on the side opposite to the side where the pair of connection electrodes are provided, and has a thickness equal to or larger than a thickness of the central portion.

17. The vibration element according to claim 16, wherein the protruding part is two or more protruding parts that are provided apart from each other when the central portion is viewed in the plan view.

* * * * *